(12) United States Patent
Chen et al.

(10) Patent No.: US 7,508,132 B2
(45) Date of Patent: Mar. 24, 2009

(54) DEVICE HAVING A GETTER STRUCTURE AND A PHOTOMASK

(75) Inventors: Chien-Hua Chen, Corvallis, OR (US); James C. McKinnell, Salem, OR (US); John Liebeskind, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 852 days.

(21) Appl. No.: 10/689,819

(22) Filed: Oct. 20, 2003

(65) Prior Publication Data

US 2005/0085052 A1 Apr. 21, 2005

(51) Int. Cl.
*H01J 61/26* (2006.01)

(52) U.S. Cl. .................................. 313/553; 417/48

(58) Field of Classification Search .................. 313/553, 313/495–497; 417/48–51
See application file for complete search history.

(56) References Cited

U.S. PATENT DOCUMENTS

| | | | | | |
|---|---|---|---|---|---|
| 4,093,339 | A | * | 6/1978 | Cross | 359/34 |
| 5,529,524 | A | * | 6/1996 | Jones | 445/24 |
| 5,538,818 | A | * | 7/1996 | Kamon | 430/5 |
| 5,688,708 | A | * | 11/1997 | Kato et al. | 445/25 |
| 5,751,107 | A | * | 5/1998 | Komatsu | 313/496 |
| 6,054,808 | A | * | 4/2000 | Watkins et al. | 313/495 |
| 6,127,777 | A | * | 10/2000 | Watkins et al. | 313/554 |
| 6,137,213 | A | * | 10/2000 | Moyer et al. | 313/309 |
| 6,139,390 | A | | 10/2000 | Pothoven et al. | |
| 6,194,830 | B1 | * | 2/2001 | Cho et al. | 313/553 |
| 6,603,260 | B1 | * | 8/2003 | Kim et al. | 313/562 |
| 2002/0077082 | A1 | | 6/2002 | Cruickshank | 455/413 |
| 2002/0190643 | A1 | * | 12/2002 | Cummings et al. | 313/553 |
| 2003/0096197 | A1 | * | 5/2003 | Lee et al. | 430/318 |
| 2003/0127336 | A1 | * | 7/2003 | Cohen et al. | 205/93 |
| 2004/0027675 | A1 | * | 2/2004 | Wu et al. | 359/619 |
| 2004/0061207 | A1 | * | 4/2004 | Ding | 257/678 |
| 2004/0092041 | A1 | * | 5/2004 | Ouvrier-Buffet et al. | 438/14 |
| 2004/0189195 | A1 | * | 9/2004 | Allemand | 313/512 |
| 2004/0203313 | A1 | * | 10/2004 | Ramamoorthi et al. | 445/31 |
| 2005/0239932 | A1 | * | 10/2005 | Akiyama et al. | 524/236 |

FOREIGN PATENT DOCUMENTS

| | | |
|---|---|---|
| EP | 1 372 095 A1 | 12/2003 |
| WO | WO 01/43357 A2 | 6/2001 |
| WO | WO 03/030474 A2 | 4/2003 |

OTHER PUBLICATIONS

"The LP Wireless Messenger"; 2001; 6 pgs.; www.lpwireless.com/messengerhelp.htm.

* cited by examiner

*Primary Examiner*—Toan Ton
*Assistant Examiner*—Hana A Sanei
(74) *Attorney, Agent, or Firm*—Donald J Coulman

(57) ABSTRACT

A device including a substrate, a getter structure coupled to the substrate, and a photomask disposed over the getter structure. The photomask has a substantially transmissive and a substantially non-transmissive region. The substantially transmissive region substantially aligns with the getter structure.

56 Claims, 9 Drawing Sheets

DEVICE HAVING A GETTER STRUCTURE AND A PHOTOMASK

BACKGROUND

1. Description of the Art

The ability to maintain a controlled ambient condition for a prolonged period, such as a low pressure or vacuum, in a microelectronic package is increasingly being sought in such diverse areas as display technologies, micro-electro-mechanical systems (MEMS) and high density storage devices. Computers, displays, and personal digital assistants as well as cellular phones may all incorporate such devices utilizing a controlled ambient condition. Vacuum packaged devices may utilize electrons to traverse some gap, for example, to excite a phosphor in the case of displays, or to modify a medium to create bits in the case of storage devices.

One of the major problems with vacuum packaging of electronic devices is the continuous outgassing of hydrogen, water vapor, carbon monoxide, and other components found in air, and from the internal components of the electronic device. Typically, to minimize the effects of outgassing one uses gas-absorbing materials commonly referred to as getter materials. Generally a separate cartridge, ribbon, or pill incorporates the getter material that is then inserted into the electronic vacuum package. In addition, before the cartridge or cartridges are sealed within the vacuum package, in order to maintain a low pressure over the lifetime of the vacuum device, a sufficient amount of getter material must be contained within the cartridge or cartridges.

Providing an auxiliary compartment situated outside the main compartment is one alternative others have taken. The auxiliary compartment is connected to the main compartment such that the two compartments reach largely the same steady-state pressure. Although this approach provides an alternative to inserting a ribbon or cartridge inside the vacuum package, it still results in the undesired effect of producing either a thicker or a larger package. Such an approach, typically, leads to increased complexity and difficulty in assembly as well as increased package size. For small electronic devices with narrow gaps, the bulkier package may be especially undesirable in many applications, such as those used in a mobile environment. In addition, the utilization of a separate cartridge increases the cost of manufacturing because it is a separate part that requires accurate positioning, mounting, and securing to another component part to prevent it from coming loose and potentially damaging the device.

Depositing the getter material on a surface other than the actual device such as a package surface is another alternative approach taken by others. For example, a uniform vacuum may be produced by creating a uniform distribution of pores through the substrate of the device along with a uniform distribution of getter material deposited on a surface of the package. Although this approach provides an efficient means of obtaining a uniform vacuum within the vacuum package, it will also typically result in the undesired effect of producing a thicker package. The thicker package is required because of the need to maintain a reasonable gap between the bottom surface of the substrate and the top surface of the getter material to allow for reasonable pumping action. In addition, yields typically decrease due to the additional processing steps necessary to produce the uniform distribution of pores.

In all of these approaches, typically, either the entire packaged device is heated to the activation temperature of the getter material used, or electrical connections are provided to heat the getter material. In the former approach, all of the components and materials utilized in the packaged device must be able to withstand the activation temperature of the getter material. In the latter approach, the additional electrical connections and electrical traces required to heat the getter material result in even more complexity.

If these problems persist, the continued growth and advancements in the use electronic devices, in various electronic products, seen over the past several decades, will be reduced. In areas like consumer electronics, the demand for cheaper, smaller, more reliable, higher performance electronics constantly puts pressure on improving and optimizing performance of ever more complex and integrated devices. The ability, to optimize the gettering performance of getters may open up a wide variety of applications that are currently either impractical, or are not cost effective. As the demands for smaller and lower cost electronic devices continues to grow, the demand to minimize both the die size and the package size will continue to increase as well.

BRIEF DESCRIPTION OF THE DRAWINGS

FIG. 3b is a cross-sectional view of the getter structure shown in FIG. 3a;

FIG. 4b is a cross-sectional view of the getter structure shown in FIG. 4a;

FIG. 5b is a cross-sectional view of the getter structure shown in FIG. 5a;

DESCRIPTION OF THE PREFERRED EMBODIMENTS

The present embodiments of this invention are directed to devices utilizing a getter structure. For example, getter activation in a vacuum packaged device, typically, involves heating the entire device to a high temperature. Generally, a compromise is made between balancing the desire to heat the getter to a high temperature and the desire to maintain the viability of the semiconductor devices, all while maintaining the integrity of the vacuum seal or bond. Such a compromise is particularly desirable in those devices that include active semiconductor devices and activate the getter by heating the entire device. The present invention utilizes a photomask disposed between a photon source and the getter structure to selectively expose the getter structure to radiation while masking out areas having circuitry, other materials, or devices that are sensitive to high temperatures. In addition, thermal isolation structures such as a cavity formed under the getter structure, a serpentine structure, or a trench isolation structure surrounding the getter structure also may be incorporated into the vacuum device to further reduce the spread of heat out of the getter structure. In this manner a getter structure may be selectively activated to a high temperature while minimizing thermal degradation or damage to devices, materials, and other components that are in close proximity to the getter structure. Typically, the temperatures used to activate a getter such as a zirconium aluminum alloy are upwards of 900 to 1000° C. or for a zirconium vanadium iron alloy temperatures of 300 to 450° C.; these temperatures may be incompatible with circuitry such as various doped structures, or are incompatible with various polymeric materials or may cause delamination or cracking due to thermal expansion mismatches. The selective activation of a getter structure utilizing a photomask allows for increases in integration, improved functionality and lower cost.

Figure 1A:
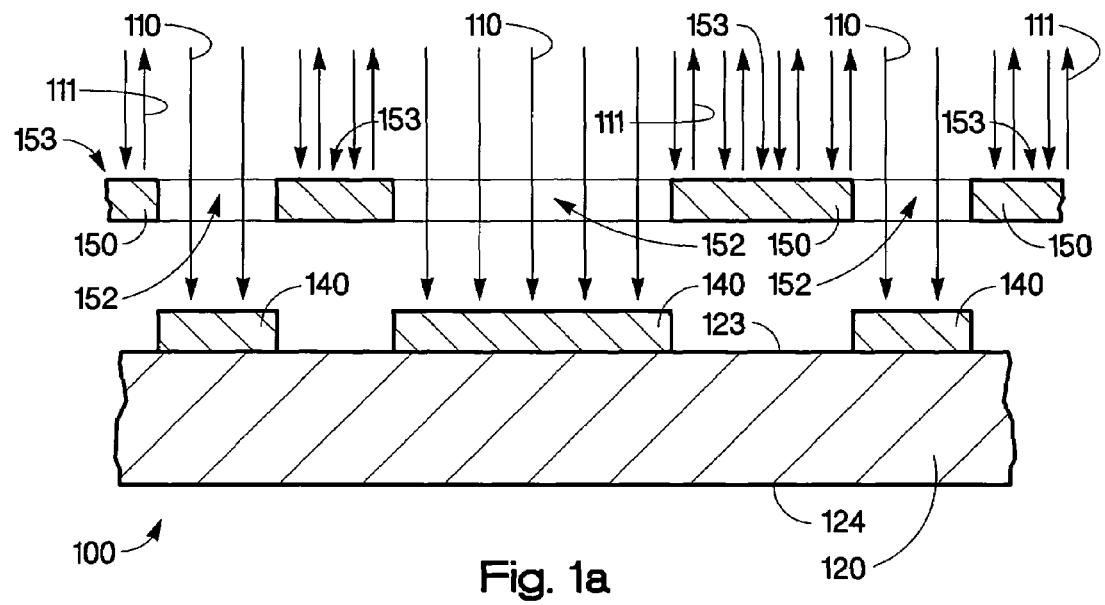
FIG. 1a is a cross-sectional view of a device according to an embodiment of the present invention.

An embodiment of device 100 of the present invention, in a cross-sectional view, is shown in FIG. 1a. In this embodiment, getter structure 140 is utilized as a vacuum pump to maintain a vacuum or gas pressure below atmospheric pressure for device 100. Device 100 may be incorporated into any device utilizing a gas pressure less than atmospheric pressure, such as, electronic devices, MEMS devices, mechanical devices, and optical devices to name a few. In alternate embodiments, getter structure 140 also may be utilized to maintain the purity of a fluid (i.e. either a liquid or gas) in a device such as a microreactor, a fuel cell, or a microfluidic distribution network. As electronic manufacturers look for higher orders of integration to reduce product costs, typically, package sizes get smaller leaving less room for getter material. Electronic circuitry and devices disposed on a wafer or substrate limit the area available for getter structures. This limited area increases the desire to fabricate getters not only with high surface area structures having a small footprint on the substrate or wafer but also to fabricate getter structures on or near temperature sensitive devices, materials, or other components. In addition, in those embodiments utilizing wafer-level packaging, a technique that is becoming more popular for its low cost, placing a getter structure directly on the wafer in close proximity to other devices, both simplifies the fabrication process, as well as lowers the cost.

In the embodiment shown in FIG. 1a, getter structure 140 is disposed on first major substrate surface 123 of substrate 120, with photomask 150 disposed over getter structure 140. Photons emitted from a photon source (not shown) such as a laser impinge upon photomask 150. Those photons incident on transmissive region 152 pass through photomask 150 and impinge upon, and are absorbed by, getter structure 140. Those photons incident on non-transmissive region 153 are either reflected for those embodiments utilizing a reflective photomask, absorbed for those embodiments utilizing an absorbing photomask, or are destroyed by interference or canceled for those embodiments utilizing a quarter wavelength dichroic filter or grating. In this embodiment, photomask 150 is a reflective mask as illustrated in FIG. 1a by transmitted photons 110 passing through transmissive region 152 and reflected photons 111 reflected off the surface of the reflective photomask in non-transmissive region 153. In alternate embodiments, combinations of the various types of masks also may be combined and utilized in a single mask. Substrate 120, in this embodiment, is an aluminum oxide substrate, however, substrate 120 may be formed from a wide range of materials including various semiconductor wafers such as silicon, gallium arsenide, indium phosphide, germanium; various glasses such as any of the borosilicate, soda lime or quartz glasses (including crystalline and amorphous glasses) as well as silicon oxides, nitrides, and silica mixed with oxides of, for example, potassium, calcium, barium or lead; other various ceramics such as boron nitride, silicon carbide, and sapphire. In this embodiment, substrate 120 may be any suitable material having the desired thermal properties to withstand the activation of getter structure 140 without suffering substantial degradation or damage.

Any of a number of different photon sources may be utilized in the present invention. For example, various lasers such as semiconductor diode lasers, carbon dioxide lasers, ultraviolet lasers or neodymium YAG lasers may be utilized. In addition, non laser sources such as infrared lamps also may be utilized.

It should be noted that the drawings are not true to scale. Further, various elements have not been drawn to scale. Certain dimensions have been exaggerated in relation to other dimensions in order to provide a clearer illustration and understanding of the present invention.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by various embodiments, it is not intended that these illustrations be a limitation on the scope or applicability of the present invention. Further it is not intended that the embodiments of the present invention be limited to the physical structures illustrated. These structures are included to demonstrate the utility and application of the present invention in presently preferred embodiments.

Figure 1B:
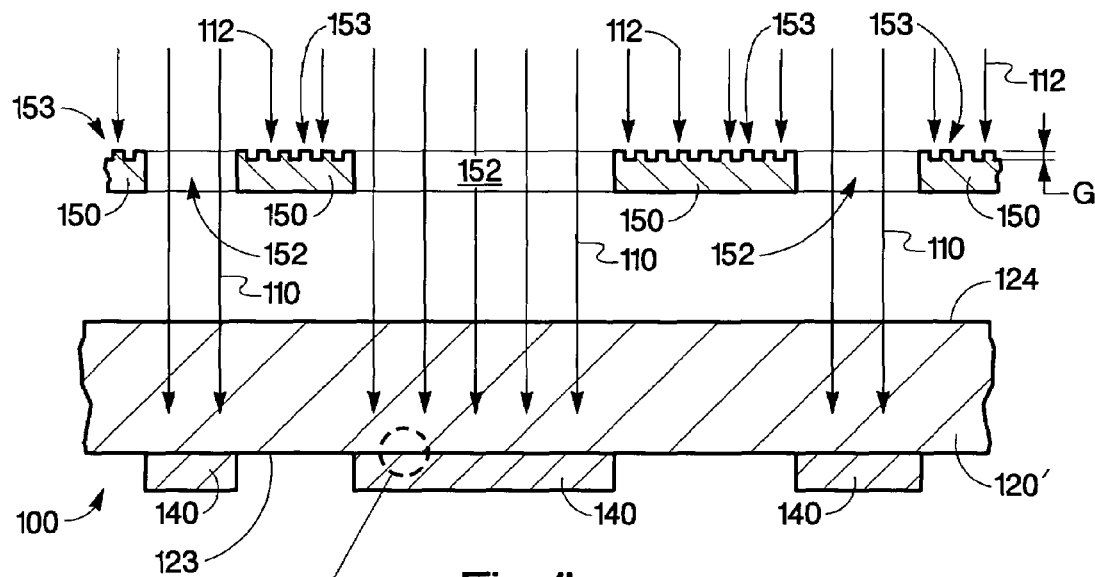
FIG. 1b is a cross-sectional view of a device according to an alternate embodiment of the present invention.

An alternate embodiment of device 100 of the present invention, in a cross-sectional view, is shown in FIG. 1b. In this embodiment, getter structure 140 is disposed on first major substrate surface 123 of substrate 120' with photomask 150 disposed over second major substrate surface 124 of substrate 120'. Photons emitted from a photon source (not shown) such as a laser impinge upon photomask 150. Those photons incident on transmissive region 152 pass through photomask 150 and impinge upon second major substrate surface 124 of substrate 120'. These photons then pass through substrate 120' and impinge upon, and are absorbed by, getter structure 140. Those photons incident on non-transmissive region 153 undergo destructive interference. In this embodiment, the grating period is less than the wavelength of the light incident on the grating. The depth of the grating G is an odd number of quarter wavelengths, of the light incident on the grating, divided by the index of refraction of the grating material (i.e. the difference in height G between the top surface and trough bottom equals some odd multiple of quarter wavelengths divided by the refractive index of the photomask material. Such a mask controls both the amplitude and phase of the transmitted light. Those photons incident upon the non-transmissive or grating region 153 (i.e. grating photons 112 as illustrated in FIG. 1b) are canceled by interference effects due to both the grating structure and the index of refraction of the grating material which combine to change the phase of the alternating regions of the reflected photons by 180°. Photomask 150 may be any suitable type of photomask such as contact, proximity, projection scanning, and projection step-and-repeat masking techniques, or other suitable lithographic masking technique.

Substrate 120', in this embodiment, is a glass substrate; however, substrate 120' may be formed from a wide range of materials. For example, semiconductor substrates such as silicon, ceramics such as sapphire and magnesium fluoride, and various glasses such as any of the borosilicate, soda lime or quartz glasses (including crystalline and amorphous glasses) as well as silicon oxides, and silica mixed with oxides of, for example, potassium, calcium, barium or lead also may be utilized. In this embodiment, substrate 120' may be any suitable material having the desired optical properties providing sufficient transmittance in the wavelength region of photons emitted from the photon source to provide sufficient heat to activate getter structure 140. In addition, substrate 120' will have sufficient thermal properties to withstand the activation of the getter structure without suffering substantial degradation or damage.

Figure 1C:
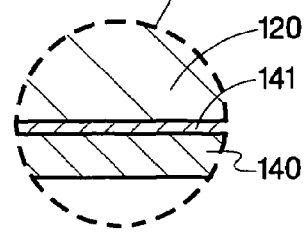
FIG. 1c is an expanded cross-sectional view of the getter structure shown in FIG. 1b according to an alternate embodiment of the present invention.

In both embodiments shown in FIGS. 1a and 1b, getter structure 140 is disposed on the substrate. However, in alternate embodiments, getter structure 140 may be disposed on any other layer or layers, formed on the substrate, that have sufficient thermal stability to withstand the temperatures desired for activation of getter structure 140. In addition, in alternative embodiments, absorption layer 141 may be disposed between the substrate and getter structure 140 as shown, in an expanded view, in FIG. 1c. Absorption layer 141 provides increased localized absorption of radiation incident upon getter structure 140 and also may provide increased adhesion of getter structure 140 to the substrate. For example, if the substrate is a glass substrate then absorption layer 141 may be a thin chromium, titanium, vanadium, or other suitable metal layer. Any suitable adhesion promoting material having the desired photon absorption, adhesion, and thermal properties for the particular substrate and getter material used may be utilized for absorption layer 141. In addition, the surface area and volume of the getter material included in getter structure 140 determines the getter pumping speed and capacity respectively of getter structure 140 after activation.

Examples of getter materials that may be utilized in the present invention include zirconium, thorium, hafnium, vanadium, yttrium, niobium, tantalum, molybdenum, terbium, and mixtures thereof. In the embodiments shown in FIGS. 1a and 1b, the getter material is a zirconium-based alloy such as Zr—Al, Zr—V, Zr—V—Ti, or Zr—V—Fe alloys. However, in alternate embodiments, any material having sufficient gettering capacity for the particular application in which device 100 will be utilized also may be used. The particular material utilized will depend on the particular application in which the getter structure is to be used, and will depend on various factors such as the species or impurities to be gettered, the environment in which the device will be utilized, the expected lifetime of the device, and any limitations on activation temperatures. For example, in devices utilizing a vacuum environment, Zr—V—Ti alloys, or Zr—V—Fe alloys generally have lower activation temperatures compared to Zr—Al alloys and thus may be utilized in those devices that are more susceptible to thermal degradation or damage. In addition, zeolites may be utilized to selectively adsorb various molecules such as water, carbon dioxide, ammonia and other organic compounds in a micro-reactor, a catalytic fuel cracker, a fuel cell, or a microfluidic distribution network. In still other embodiments, various reactive metals or organic compounds that selectively adsorb or absorb an unwanted impurity also may be utilized.

Getter structure 140 is created, in the embodiments shown in FIGS. 1a and 1b, using conventional sputtering, vapor deposition or evaporation equipment, however, in alternate embodiments, other deposition techniques such as electrodeposition, or laser activated deposition also may be utilized. In addition, other techniques such as electrophoresis, manual, or mechanical application, including screen printing, inkjet printing, spraying suspensions of the getter material in a suspending medium, can be utilized to form a wide variety of getter structures using a wide variety of getter materials. The particular deposition technique utilized will depend on the particular material chosen. For those embodiments utilizing a blanket deposition of the material over the substrate, generally, conventional photolithographic and etching techniques may be utilized to form the desired pattern of the getter structure. In addition, a lift-off process also may be utilized where a blanket getter layer or film is deposited over a predefined photoresist pattern having re-entry photoresist sidewall profiles in the opening regions of the photoresist. The getter structures are formed when the unwanted getter material deposited on the photoresist is lifted off or removed with the photoresist. Both additive and subtractive processes may be utilized to form the desired pattern of the getter structure.

Figure 2A:
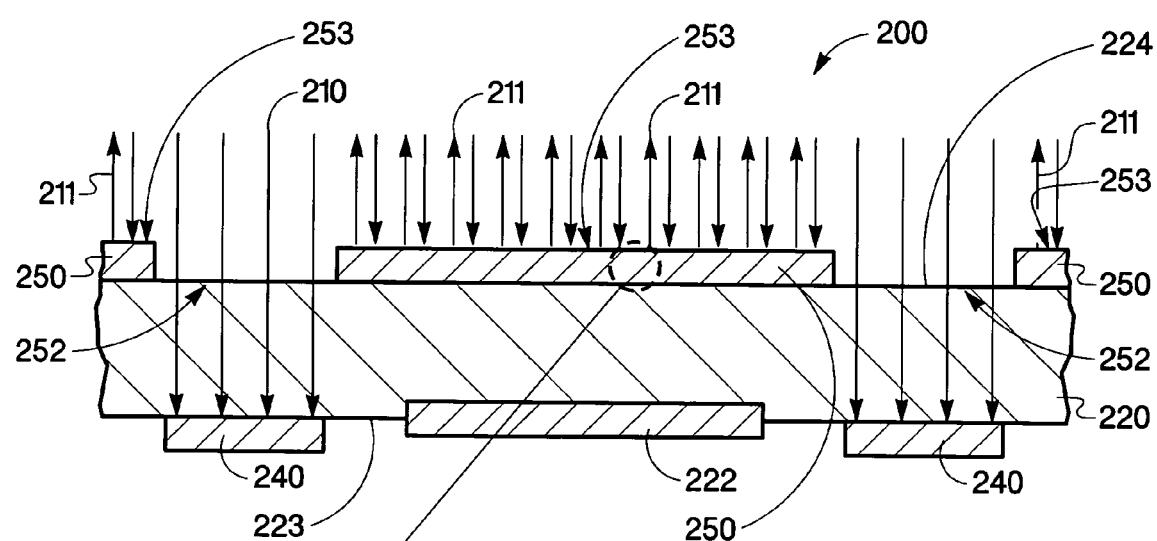
FIG. 2a is a cross-sectional view of a device according to an alternate embodiment of the present invention.

An alternate embodiment of a device of the present invention is shown, in a cross-sectional view, in FIG. 2a. In this embodiment, device 200 includes photomask 250 that is disposed on second major substrate surface 224 of substrate 220 and getter structure 240 disposed on first major substrate surface 223 of substrate 220. In addition, device 200 also includes active device 222 disposed on first major substrate surface 223 of substrate 220. Active device 222 includes, for example, various transistors (including thin-film-transistor (TFT) technology using polysilicon on glass substrates), diodes, logic cells, or passive components such as capacitors and resistors as well as sensors, transducers, electron emitters, bolometers, and superconductoring high Q radio frequency (RF) filters to name just a few of the many active devices that may be utilized in the present invention either separately or in combination. In alternate embodiments, active device 222 also may be integrated with various MEMS devices such as microfluidic channels, reactor chambers, micromovers, and actuators to name just a few of the many MEMS devices that may be utilized. For example, microfabricated device 200 may include a micro mirror disposed on device substrate 220 including a reflective surface disposed on the micro mirror. Another example is a bolometer or other radiation detector having a light absorbing surface disposed on said device substrate. To simplify the drawing active device 222 is represented as only a single layer in FIG. 2a although it is readily apparent that such devices, typically, may be realized as a stack of thin film layers.

Substrate 220, in this embodiment, is a mono-crystalline silicon substrate; however, any substrate suitable for forming electronic devices, such as germanium, gallium arsenide, indium phosphide, glass, and sapphire are just a few examples that also may be utilized. As described above, for those embodiments where the photons used to activate the getter structure are transmitted through the substrate, the substrate may include any suitable material having sufficient transmittance in the wavelength region of photons emitted from the photon source to provide sufficient heat to activate the getter structure as well as having sufficient thermal properties to withstand the activation of the getter structure. The present invention is not intended to be limited to those devices fabricated in silicon semiconductor materials, but will include those devices fabricated in one or more of the available semiconductor materials and technologies known in the art, such as thin-film-transistor (TFT) technology using polysilicon on glass substrates. Further, the substrate is not restricted to typical wafer sizes, and may include processing a sheet or film, for example, a single crystal sheet or a substrate handled in a different form and size than that of conventional wafers or substrates. The actual substrate material utilized will depend on various system components such as the particular environment to which the device will be subjected, the presence or absence of active devices, the pressure to be maintained within the device, as well as the expected lifetime of the device.

Photomask 250 as illustrated in FIG. 2a is reflective mask similar to that described in FIG. 1a. However, in alternate embodiments photomask 250 may be any of the type of photomasks described above. In this embodiment, the reflective regions absorb less than 5 percent of the photons impinging upon the reflective region, however, in alternate embodiments, reflective masks where the reflective regions absorb up to about 25 percent of the incident light also may be utilized. The reflective photomask or the reflective film may be formed utilizing any material or system of layers providing sufficient reflectance to keep the temperature of temperature sensitive circuitry, materials, and devices below a desired value. For example, the reflective region 253 may utilize a thin metal film, such as gold or aluminum deposited on a glass substrate. For those embodiments utilizing a photomask having only reflective regions in combination with transmissive regions the photomask may be formed utilizing, for example, a self supporting thin metal sheet having openings formed therein to form transmissive regions 252, or a non-self supporting sheet disposed and supported on a material having sufficient transmission in the energy region of the photons utilized to heat the getter structure. In addition, high-reflectance regions also may be formed utilizing multiple quarter wave dielectric layers that alternate between high and low refractive indices to form a reflective layer. The refractive index at each interface goes from high to low for a light ray passing through the layers, phase reversal establishes constructive-interference providing in some optimized systems almost 100 percent reflectance at a particular wavelength. Such a coating may be utilized to form not only transmissive and non-transmissive regions but also regions having partial reflectance providing the ability to design temperature gradients and specified temperatures localized in both the getter structure and substrate being illuminated. By utilizing such a mask heating of the device and in particular the substrate may be controlled to provide a two dimensional temperature profile. In such a manner heating of the entire substrate or at least a substantial portion may be optimized at various discreet locations to provide substantial protection to the most sensitive areas and varying degrees of protection to other less sensitive areas. In addition, transmissive regions 252, for those embodiments utilizing a glass substrate for photomask 250, also may include antireflective coatings. For example, two quarter-wave layers of materials having refractive indices $n_2$ and $n_3$ will substantially reduce any surface reflectance at a given wavelength when $n_3/n_2=(n_s/n_a)^{1/2}$ where $n_s$ is the index of refraction of the substrate and $n_a$ is the refractive index of air assuming the environment surrounding the photomask is air. Adding a third layer typically will broaden the range of wavelengths in which reflectivity is minimized. In addition, adding more layers increases the design alternatives.

Figure 2B:
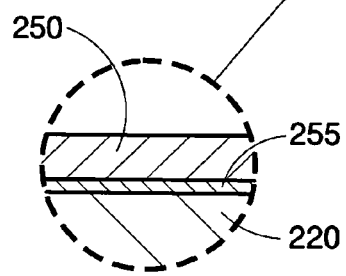
FIG. 2b is an expanded cross-sectional view of the photomask shown in FIG. 2a according to an alternate embodiment of the present invention.

In this embodiment, any of the photon sources described above that emit in the infrared region of the electromagnetic spectrum from about 1.2 micrometers in wavelength to about 10 micrometers in wavelength such as a carbon dioxide laser or solid state lasers may be utilized. In this embodiment, the reflective photomask is formed on substrate 220, however, in alternate embodiments photomask 250 may be disposed on any other layer or layers, formed on second major substrate surface 224 of the substrate. In still other embodiments, as illustrated in the expanded cross-sectional view shown in FIG. 2b, mask release layer 255 may be disposed between photomask 250 and substrate 220. Mask release layer 255 may be any layer providing sufficient adhesion of photomask 250 to substrate 220 while providing controlled release of the photomask from the substrate after the getter structure has been activated. For example, mask release layer 255 may be a metal or dielectric film that is more rapidly etched than the substrate material. Another example is the use of a polymer film such a polyvinyl alcohol that is water soluble or polymers such as polycarbonate or polyacrylates that are solvent soluble.

Figure 3A:
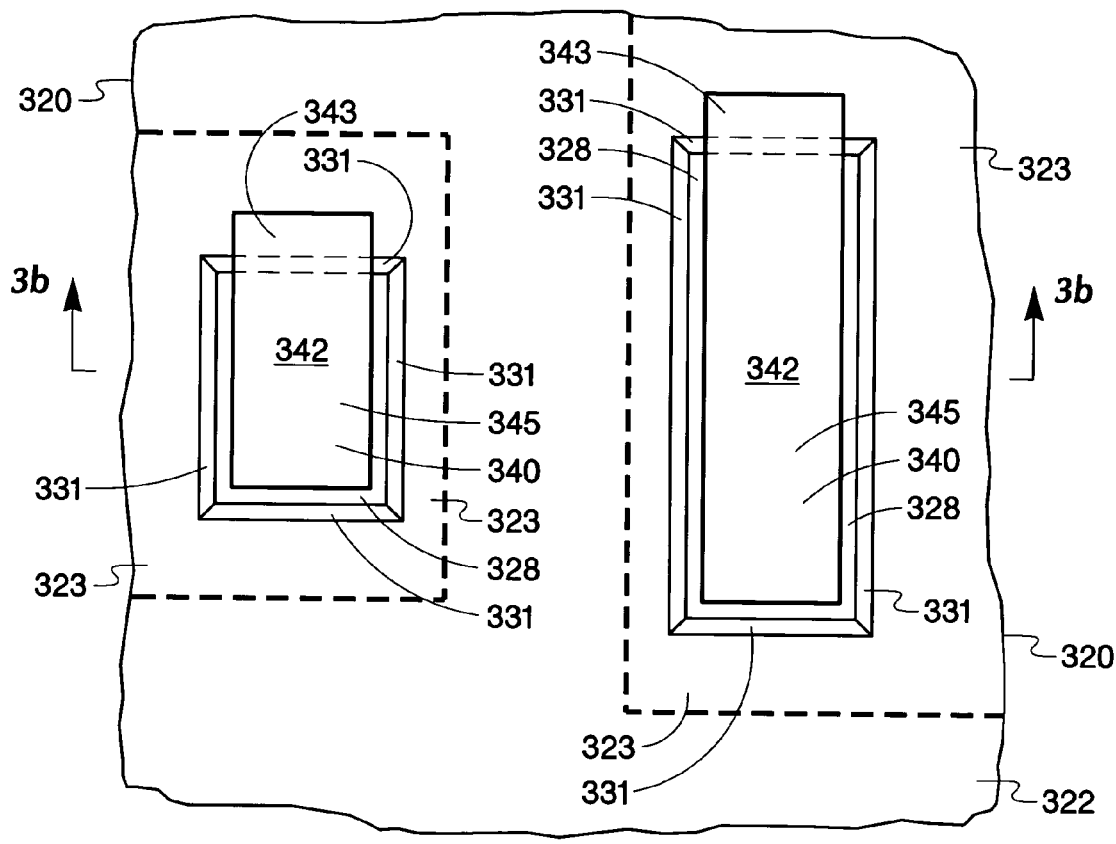
FIG. 3a is a plan view of a thermally isolated getter structure according to an alternate embodiment of the present invention.
Figure 3B:
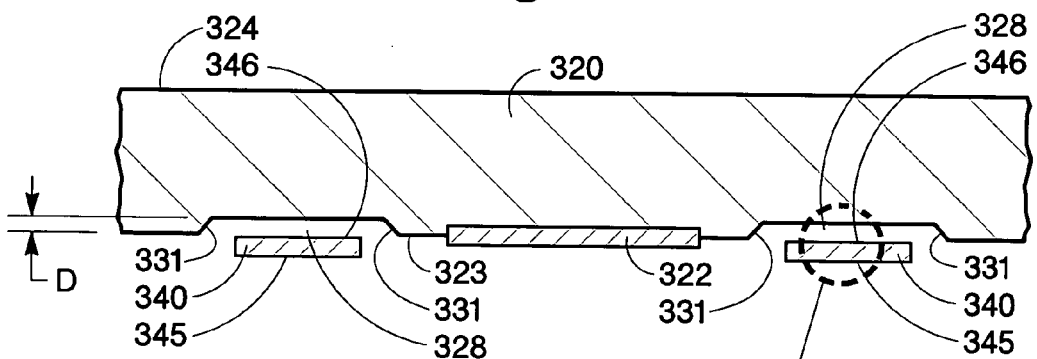

An alternate embodiment of a getter structure utilized in a device of the present invention is shown, in a plan view, in FIG. 3a, and in a cross-sectional view, in FIG. 3b. In this embodiment, getter structure 340 includes free standing or suspended mass portion 342 and thermally coupled portion 343, which is thermally coupled to substrate 320. Suspended mass portion 342 is suspended over cavity 328 formed in substrate 320. Cavity 328 is formed in substrate 320 to a depth D, and includes sidewalls 331. In this embodiment, sidewalls 331 are depicted as having sloping sidewalls from substrate surface 323 to the bottom of cavity 328; however, in alternate embodiments straight vertical or orthogonal sidewalls or other more complex structures also may be utilized.

Figure 3C:
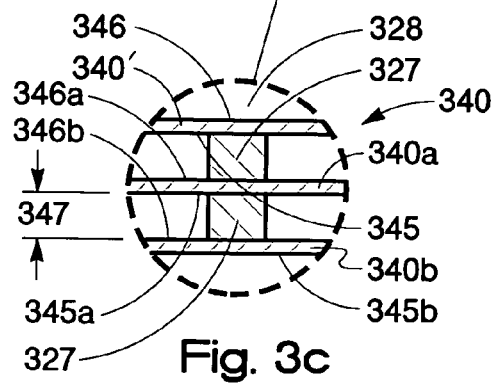
FIG. 3c is an expanded cross-sectional view of a getter structure according to an alternate embodiment of the present invention.

Getter structure 340 includes first major getter surface 345 facing away from first major substrate surface 323 and second major getter surface 346 facing toward first major substrate surface 323, in this embodiment. Cavity 328 provides a path for gas molecules or particles to impinge upon both first and second major getter surfaces 345 and 346 of getter structure 340, increasing the exposed surface area available for pumping residual gas particles providing an increase in the effective pumping speed of getter structure 340. In addition, cavity 328 also provides thermal isolation of getter structure 340 from substrate 320. Heat generated within getter structure 340, typically, may be lost through radiation, convection, or thermal conduction along the length of suspended mass portion 342 to thermally coupled portion 343. In this embodiment, getter structure 340 is illustrated, in FIGS. 3a and 3b, as a single layer structure; however, in alternate embodiments getter structure 340 may include multiple getter layers stacked upon each other with gap 347 formed between the layers as illustrated, in a cross-sectional view in FIG. 3c. In this embodiment, getter structure 340 includes getter layer 340' having both first and second major getter surfaces 345, and 346 with second major getter surface 346 facing cavity 328. In addition, getter structure 340 also includes getter layers 340a and 340b each having first and second major getter surfaces 345a, 346a and, 345b and 346b respectively with support spacer 327 disposed between the getter layers. Each getter layer has a getter perimeter greater than the perimeter of each support spacer providing. Such a structure provides a further increase in the exposed surface area of the getter structure and a corresponding further increase in the effective pumping speed of getter structure 340.

Figure 4A:
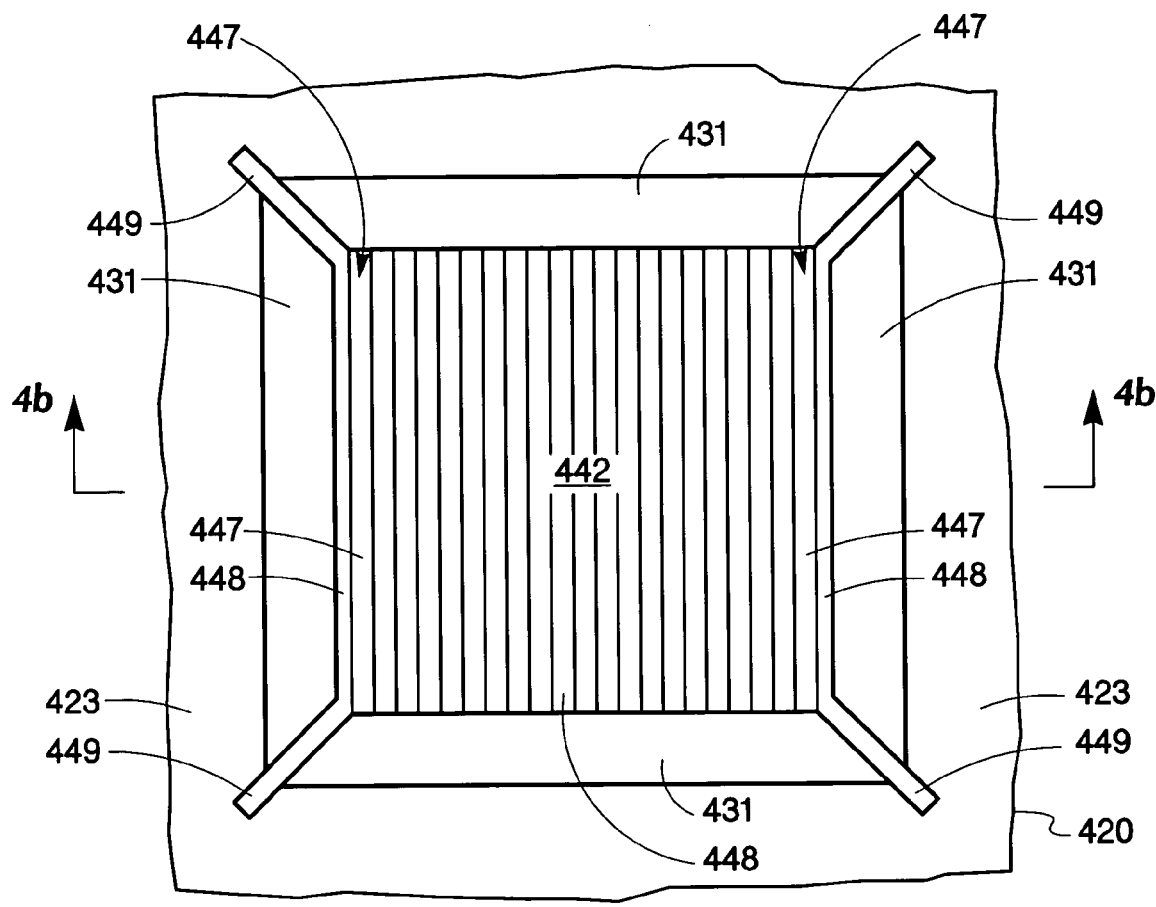
FIG. 4a is a plan view of a getter structure according to an alternate embodiment of the present invention.
Figure 4B:
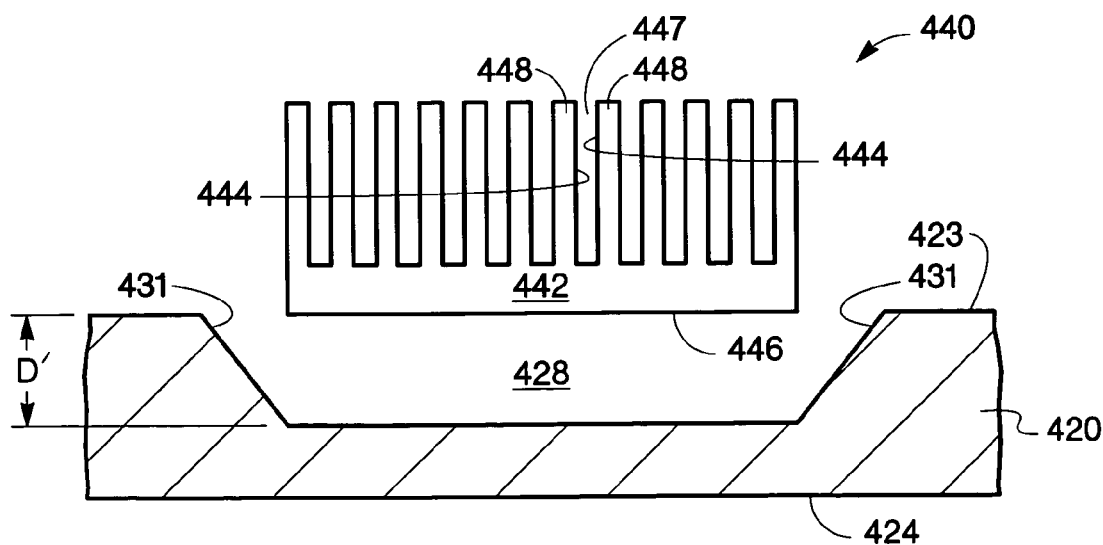

An alternate embodiment of a getter structure utilized in a device of the present invention is shown, in a plan view, in FIG. 4a, and in a cross-sectional view, in FIG. 4b. In this embodiment, getter structure 440 includes free standing or suspended mass portion 442 and getter tethers 449, which mechanically couple suspended mass portion 442 to substrate 420. In addition, tethers 449 reduce the thermal conductivity of getter structure 440 to substrate 420. Suspended mass portion 442 is suspended over cavity 428 formed in substrate 420. Cavity 428 is formed in substrate 420 to a depth D', and includes sidewalls 431 (see FIG. 4b). In this embodiment, sidewalls 431 are depicted as sloping sidewalls, however in alternate embodiments sidewalls having straight vertical or orthogonal sidewalls to the bottom of cavity 428 or other more complex structures also may be utilized. In still other embodiments, the getter tethers may be oriented vertically between the bottom of cavity 428 (shown in FIG. 4b) and the bottom surface or second major getter surface 448 (shown in FIG. 4b).

Getter structure 440 includes ribs 448 separated by gap or getter trench 447 providing a path for gas molecules to impinge upon rib surfaces 444. In addition, cavity 428 provides a path for gas molecules or particles to impinge upon second major getter surface 446 of getter structure 440. The utilization of both the ribs and their corresponding rib surfaces, the cavity, and the corresponding second major getter surface provide for an increase in the exposed surface area available for pumping residual gas particles as well as an increase in the effective pumping speed of getter structure 440. In addition, cavity 428 also provides thermal isolation of getter structure 440 from substrate 420. It should be understood that various combinations of structures may be utilized on the same structure such as ribbed getter structure formed directly on the substrate. In alternate embodiments, the getter layers or films may be formed horizontally or parallel to second major getter surface 446 forming a multi-layered structure similar to that shown in FIG. 3c.

Figure 5A:
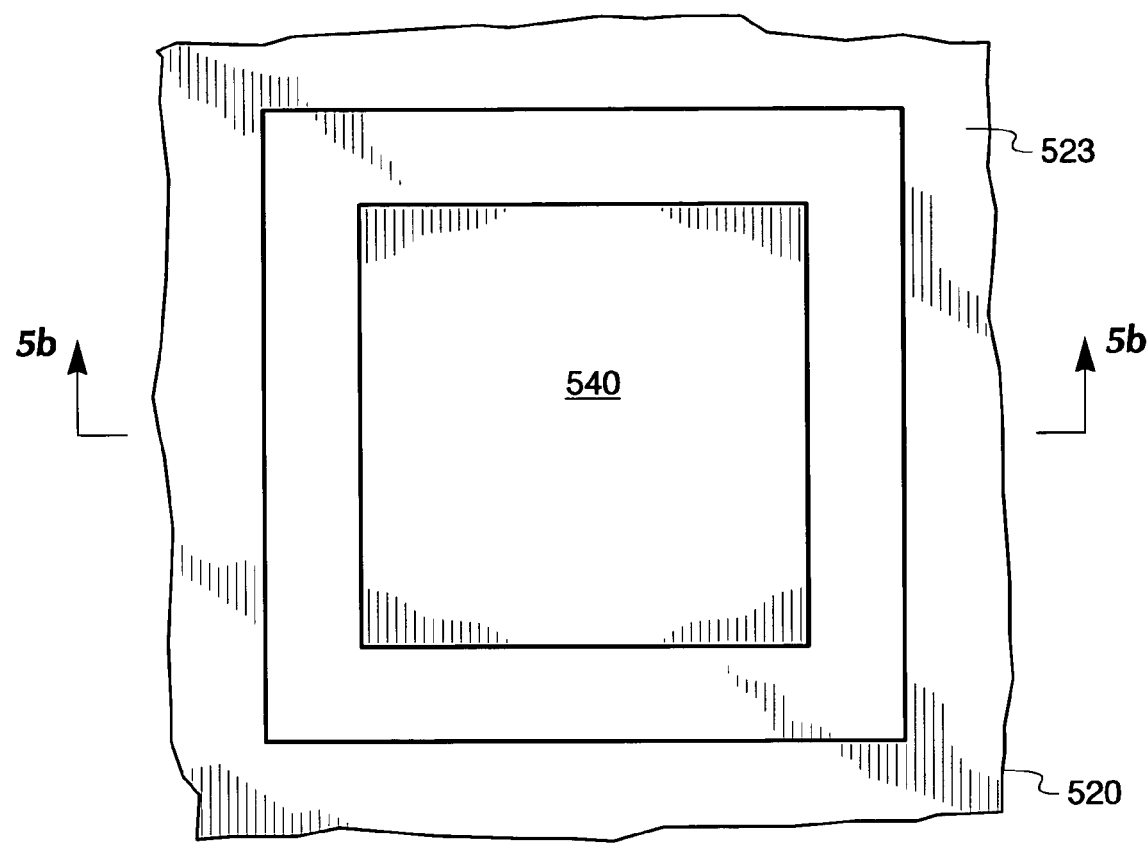
FIG. 5a is a plan view of a getter structure according to an alternate embodiment of the present invention.
Figure 5B:
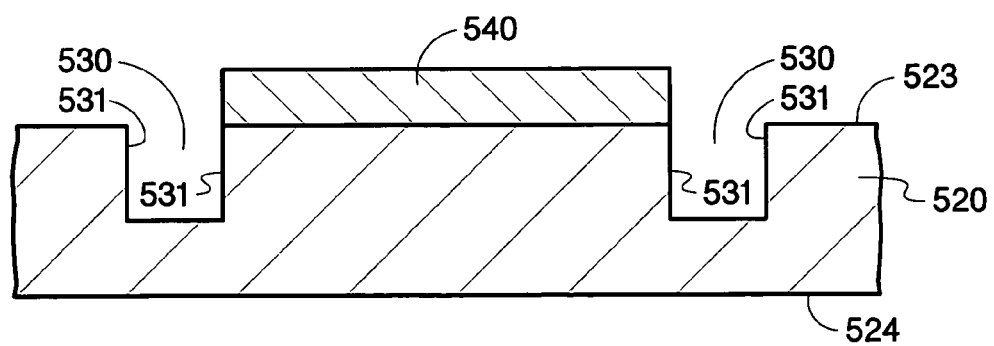

An alternate embodiment of a getter structure utilized in a device of the present invention is shown, in a plan view, in FIG. 5a, and in a cross-sectional view, in FIG. 5b. In this embodiment, getter structure 540 is disposed on first major substrate surface 523 of substrate 520. Trench 530 is formed in substrate 520 to a predetermined depth. The particular depth utilized will depend on various factors such as the activation temperature of the getter material utilized in the getter structure, the thermal conductivity of the substrate, the temperature sensitivity of surrounding devices, circuitry, and materials. In this embodiment, sidewalls 531 of trench 530 are depicted as having straight vertical or orthogonal sidewalls to the bottom of trench 530, however in alternate embodiments sloping sidewalls or other more complex structures also may be utilized. In still other embodiments, a cavity also may be formed under getter structure 540 with an opening formed in one or more of the sidewalls in trench 530, including a cavity leaving only posts or support structures in, for example, the corners of getter structure 540. It should be appreciated that multiple combinations of the embodiments shown in FIGS. 3-5 also can be utilized in a particular device.

For example, the getter structure shown in FIGS. 4a-4b may be formed directly on a substrate along with cavity structures as shown in FIGS. 3a-3b. Another example would be to combine the getter structure shown in FIG. 3c with the structure shown in FIGS. 4a-4b to create still another embodiment. In addition, it should also be appreciated that these various combinations of getter structures also may be combined with any of the various photomask embodiments described above.

Figure 6:
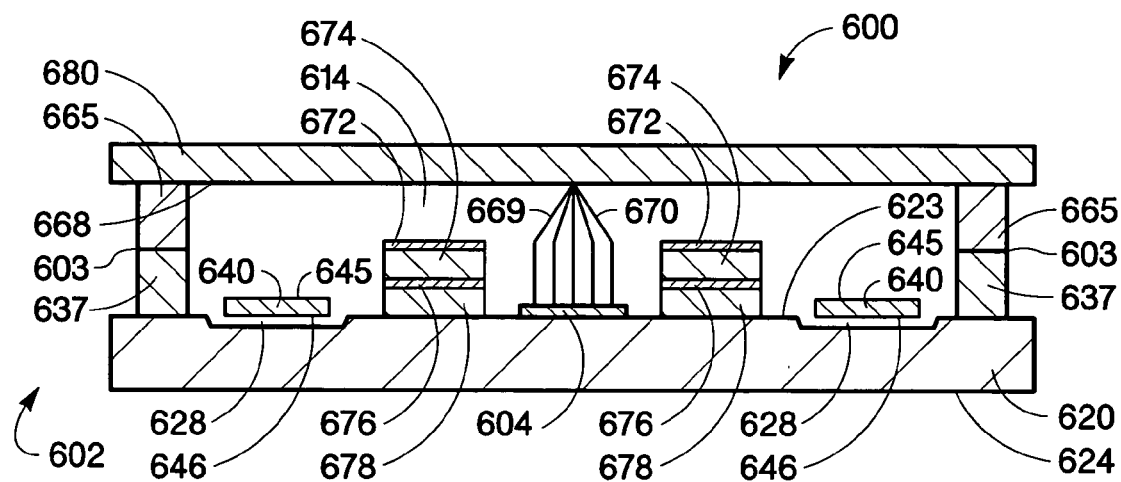
FIG. 6 is a cross-sectional view of a getter structure and integrated vacuum device according to an alternate embodiment of the present invention.

An alternate embodiment of the present invention is shown in FIG. 6, in a cross-sectional schematic view. Electronic device 600 having integrated vacuum device 604 includes anode 680 such as a display screen or a mass storage device that is affected by electrons 669 when they are formed into a focused beam 670. Anode surface 668 is held at a predetermined distance from second electron lens element 672. Getter structure 640, in this embodiment, includes first major getter surface 645 facing away from first major substrate surface 623 and second major getter surface 646 facing toward first major substrate surface 623. In alternate embodiments, getter structure 640 may utilize any of the embodiments described above.

Electronic device 600, in this embodiment, is enclosed in sealed package 602 providing a vacuum enclosure in which vacuum device 604 may operate. Sealed package 602, in this embodiment, includes a vacuum seal formed between the anode 680 and substrate 620. In alternate embodiments, sealed package 602 may be formed between an anode substrate on which anode 680 is disposed or an anode carrier on which anode 680 is mounted and substrate 620 or a substrate or chip carrier on which substrate 620 may be disposed or mounted. Substrate bond structure 637 is disposed on substrate 620. Depending on the particular sealing technology utilized, substrate bond structure 637 may be formed on substrate 620 directly or it may be formed on a compatible layer or film that is formed on substrate 620. Anode bond structure 665 is disposed on anode 680. Again depending on the particular sealing technology utilized, anode bond structure 665 may be formed on anode 680 directly or it may be formed on a compatible layer or film that is formed on anode 680. Anode bond 665 structure and substrate bond structure 637 form package seal 603 forming vacuum or interspace region 614. In this embodiment, substrate bond structures 637 and anode bond structures 665 may utilize a wide variety of materials depending on the particular sealing technology. For example, a gold-silicon eutectic for bonding may be utilized to bond substrate 620 to anode 680 if substrate 620 is a silicon substrate. Or a softer lower melting-point solder may be utilized if substrate 620 is, for example, a silicon, glass, or other inorganic material. In alternate embodiments, a frit glass seal may be utilized to form sealed package 602. In still other embodiments, package seal 603 may be made by a variety of techniques such as, for example, thermal compression bonding or brazing, as well as other techniques.

The material utilized for the bond structures will depend on the particular materials utilized for substrate 620, and anode 680. In those embodiments utilizing a chip carrier or an anode carrier or both, various ceramic materials including various glasses as well as metals may be utilized to form one or both of the carriers, however, at least one carrier should either be transmissive to the photon energy utilized to activate the getter structure or structures or have transmissive regions aligned with the getter structure or structures. The particular material utilized to form both a carrier as well as the bond structures will depend on, for example, the desired pressure to be maintained; the temperature and humidity and other environmental factors to which the device will be exposed; and the amount of stress that may be imparted to the device as a result of the packaging process; as well as, the particular sealing technology to be utilized.

A low melting-point inorganic oxide glass such as, for example, lead oxide or boric oxide also may be used for bond structures 637 and 665 to generate seal 603. In still other embodiments, anodic bonding may be utilized to attach device 600 made on a silicon substrate to the anode either made out of glass or having a glass surface to bond to the silicon. The silicon surface of the substrate and, for example, the glass surface of the anode are placed between two electrodes applying an appropriate polarity voltage across the interface of the two materials. The particular bonding process will depend on various parameters such as the magnitude and duration of the applied voltage, the temperature of the two surfaces during the bonding surface, and the area to be bonded. Getter material also may be applied or deposited on various portions of anode 680 to provide pumping of residual gases within sealed package 602 during operation of microfabricated device 600.

In this embodiment, any of the various photomask embodiments described above may be utilized. For example, if substrate 620 is a glass or silicon substrate then the photomask (not shown) may be disposed on or some predetermined distance away from second major substrate surface 624 of susbstrate 620. However, if substrate 620 is opaque to the wavelength or energy of the photons used to activate getter structure 640 then the photomask may be disposed on or some predetermined distance away from anode 680. Although in the latter embodiment, anode 680 may not be transmissive to the wavelength or energy of the photons used to activate the getter structures, anode 680 includes at least transmissive regions aligned with the getter structure or structures.

Integrated vacuum device 604, in this embodiment, is shown in a simplified block form and may be any of the electron emitter structures well known in the art such as a Spindt tip or flat emitter structure. Second lens element 672 acts as a ground shield. Vacuum device 604 is disposed over at least a portion of device substrate 620. First insulating or dielectric layer 674 electrically isolates second lens element 672 from first lens element 676. Second insulating layer 678 electrically isolates first lens element 676 from vacuum device 604 and substrate 620. In alternate embodiments, more than two lens elements also may be utilized to provide, for example, an increase in intensity of emitted electrons 669, or an increase in focusing of electron beam 670, or both. Utilizing conventional semiconductor processing equipment both the lens elements and dielectrics may be fabricated. In still other embodiments first and second lens elements may be formed utilizing a getter, and a portion of first and second insulating layers may be etched away and utilized as support structures to form additional getter structures.

As a display screen, an array of pixels (not shown) are formed on anode surface 668, which are typically arranged in a red, blue, green order, however, the array of pixels also may be a monochromatic color. An array of emitters (not shown) are formed on device substrate 620 where each element of the emitter array has one or more integrated vacuum devices acting as an electron emitter. Application of the appropriate signals to an electron lens structure including first and second electron lens elements 672 and 676 generates the necessary field gradient to focus electrons 669 emitted from vacuum device 604 and generate focused beam 670 on anode surface 668.

As a mass storage device, anode surface 668 typically includes a phase-change material or storage medium that is affected by the energy of focused beam 670. The phase-change material generally is able to change from a crystalline to an amorphous state (not shown) by using a high power level of focused beam 670 and rapidly decreasing the power level of focused beam 670. The phase-change material is able to change from an amorphous state to a crystalline state (not shown) by using a high power level of focused beam 670 and slowly decreasing the power level so that the media surface has time to anneal to the crystalline state. This change in phase is utilized to form a storage area on anode surface 668 that may be in one of a plurality of states depending on the power level used of focused beam 670. These different states represent information stored in that storage area.

An exemplary material for the phase change media is germanium telluride (GeTe) and ternary alloys based on GeTe. The mass storage device also contains electronic circuitry (not shown) to move anode surface 668 in a first and preferably second direction relative to focused beam 670 to allow a single integrated vacuum device 604 to read and write multiple locations on anode surface 668. To read the data stored on anode or media surface 668, a lower-energy focused beam 670 strikes media surface 668 that causes electrons to flow through the anode or media substrate 680 and a reader circuit (not shown) detects them. The amount of current detected is dependent on the state, amorphous or crystalline, of the media surface struck by focused beam 670.

Figure 7:
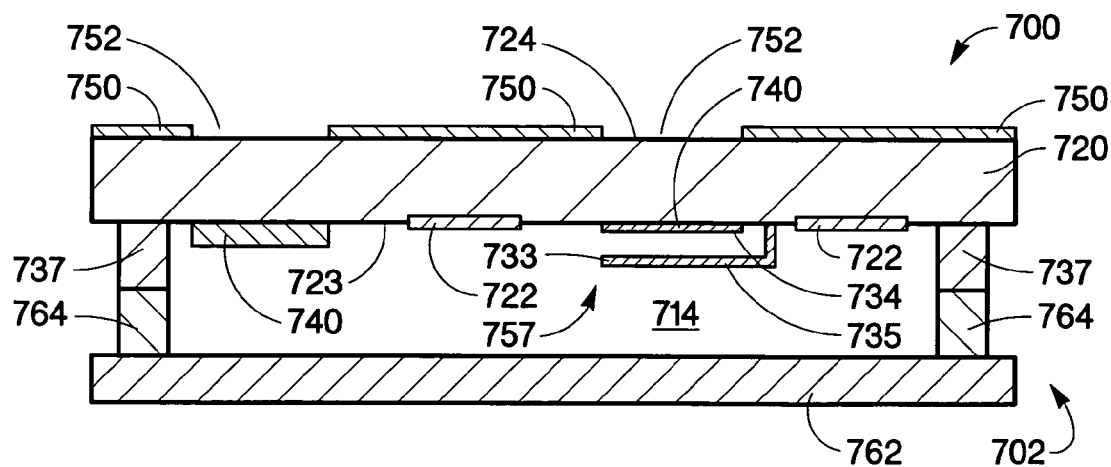
FIG. 7 is a cross-sectional view of a getter structure and integrated accelerometer device according to an alternate embodiment of the present invention.

An alternate embodiment of the present invention is shown in FIG. 7, in a cross-sectional schematic view. Electronic device 700 is an accelerometer sensing a change in capacitance induced by an acceleration force. The accelerometer includes resonating structure 757 enclosed inside sealed cavity 714 that also includes getter structure 740 and active devices 722. Resonating structure 757 includes cantilever beam 733 that forms cantilever capacitive plate 735 that forms half of the sensing capacitor. In this embodiment, cantilever beam 733 is a metal beam, however, in alternate embodiments, cantilever beam 733 also may be formed utilizing dielectric materials with a conductive layer disposed on the surface facing the fixed capacitive plate. For example, cantilever beam may be formed from silicon oxide, nitride or combinations thereof with an aluminum or gold layer formed on the surface of the beam facing the fixed plate. In still other embodiments, in which substrate 720 is opaque to the energy of the photons used to activate getter structure 740 then cantilever beam may be formed from a getter material or include a getter structure disposed on the cantilever beam. In such an embodiment the getter structures are activated by photons passing through transmissive portions of baseplate 762. Further, both baseplate 762 and substrate 720 may be transmissive to the photons utilized to active the getter structures in which case getter structures may be disposed both on the base plate as well as the substrate.

Fixed capacitive plate 734 is disposed on substrate 720 and forms the other half of the sensing capacitor. In this embodiment, fixed capacitive plate 734 is formed utilizing a getter material; however, in alternate embodiments fixed capacitive plate 734 may be formed utilizing any appropriate conductive material such as those commonly utilized in the semiconductor industry for metalization (e.g. aluminum, gold, tungsten etc.). The fixed and cantilever capacitive plates are coupled to active devices 722 to sense DC accelerations or dynamic vibrations or both. Both digital and analog outputs may be utilized in this embodiment. Sealed cavity 714, in this embodiment, utilizes getter structure 740 to maintain a vacuum reducing the damping of resonating structure 757 due to gas viscosity. In an alternate embodiment, getter structure 740 may be utilized to remove or reduce the moisture level of an inert gas included in sealed cavity 714 to reduce stiction in, for example, a micro-mirror device. In still other embodiments, a simple bimorph cantilever to sense temperature, other mechanical resonators such as a mechanical radio frequency (RF) resonator, gyros, or micro-movers also may be utilized.

Electronic device 700, in this embodiment, is enclosed in sealed package 702 providing a vacuum enclosure in which resonating structure 757 may operate. However, in alternate embodiments, sealed package 702 also may be an enclosure providing fluid flow (i.e. gas or liquid) for other applications such as, for example, micro turbines, fuel cells, chemical reactors, and catalytic fuel crackers. Sealed package 702, in this embodiment, includes a vacuum seal formed between the base plate 762 and substrate 720. Substrate bond structure 737 is disposed on substrate 720 and base plate bond structure 764 is disposed on base plate 762. In this embodiment, substrate bond structures 737, base plate structures 764, and base plate 762 may utilize a wide variety of materials depending on the particular sealing technology. Any of the materials and sealing technologies described above may be utilized in this embodiment. As noted above, the particular material utilized to form both a base plate as well as the bond structures will depend on, for example, the desired pressure to be maintained, the temperature and humidity and other environmental factors to which the device will be exposed, and the amount of stress that may be imparted to the device as a result of the packaging process, as well as, the particular sealing technology utilized. In addition, any of the various photomask embodiments described above may be utilized in this embodiment. For example, if substrate 720 is a glass or silicon substrate photomask 750 may be disposed on (as shown in FIG. 7) or some predetermined distance away from second major substrate surface 724. However, in those embodiments in which substrate 720 is opaque to the energy of the photons used to activate getter structure 740 then the photomask may be disposed on or some predetermined distance away from baseplate 762.

Figure 8:
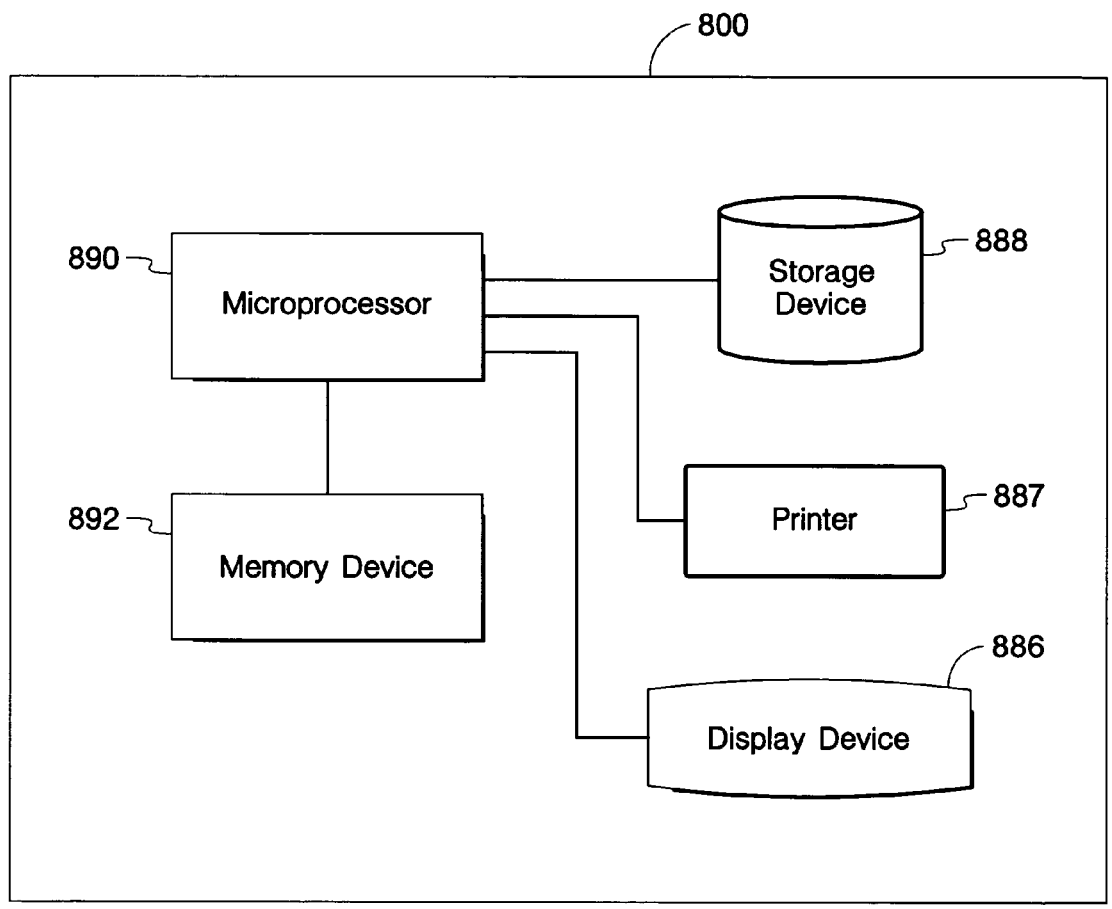
FIG. 8 is a block diagram of an electronic device according to an alternate embodiment of the present invention.

Referring to FIG. 8 an exemplary block diagram of electronic device 800, such as a computer system, video game, Internet appliance, terminal, MP3 player, cellular phone, or personal digital assistant to name just a few is shown. Electronic device 800 includes microprocessor 890, such as an Intel processor sold under the name "Pentium Processor," or compatible processor. Many other processors exist and also may be utilized. Microprocessor 890 is electrically coupled to a memory device 892 that includes processor readable memory that is capable of holding computer executable commands or instructions used by the microprocessor 890 to control data, input/output functions, or both. Memory device 892 also may store data that is manipulated by microprocessor 890. Microprocessor 890 is also electrically coupled to either one of, to all, or to some combination of storage device 888, printer 887, and display device 886. Microprocessor 890, memory device 892, printer 887, storage device 888, and display device 886 each may contain an embodiment of the present invention as exemplified in earlier described figures and text showing vacuum devices having a getter structure.

Figure 9:
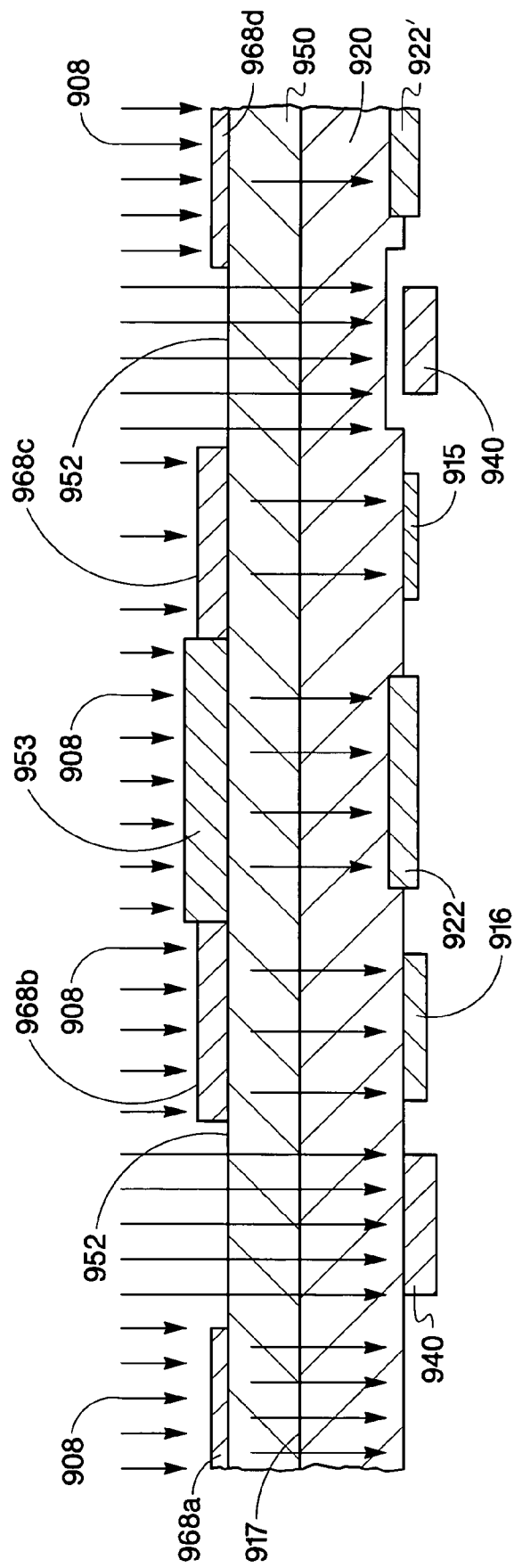
FIG. 9 is a schematic cross-sectional view of a device according to an alternate embodiment of the present invention.

An alternate embodiment of the present invention is illustrated in FIG. 9, in a cross-sectional view. In this embodiment, photomask 950 includes reflective, partial reflective and non-reflective regions. For illustrative purposes only substrate 920 includes, besides getter structures 940, a number of representative regions having various circuitry, materials, and devices that have varying degrees of temperature sensitivity. For example, regions 922 and 922' may include shallow junction devices or semiconductor devices utilizing organic or polymeric materials and in this illustration represent the most temperature sensitive regions with region 922 being more susceptible to temperature than 922'. Region 915 represents the next most sensitive region. Region 917 is the least sensitive with region 916 being between 917 and 915 in temperature sensitivity. Transmissive regions 952 are formed in photomask 950 providing substantial transmission of incident photons 908. Generally transmissive regions 952 will have transmissivities greater than 90 percent and those utilizing either antireflective coatings or openings formed in the mask substrate may approach 100 percent transmission. Non-transmissive regions are represented by structure 953 for illustrative purposes only and may be a metal reflective film or multiple quarter wave dielectric layers that alternate between high and low refractive indices to form a reflective layer as described earlier. Generally non-transmissive regions 953 will have transmissivities of less than a few percent and typically approaching zero percent transmission. Partial transmissive regions 968a, 968b, 968c, and 968d provide varying degrees of transmission of incident photons 908 to heat temperature sensitive regions 917, 916, 915, and 922' respectively to various desired temperatures. For illustrative purposes only partial transmissive region 968a represents in the figure 80 percent transmission while regions 968b, 968c, and 968d represent 60, 40 and 20 percent transmission respectively. It should be appreciated that the percent transmission may be varied continuously over the entire range from 99.9 percent to zero percent. For those embodiments utilizing a vacuum device such a combination of transmissive, partial transmissive, and non-transmissive regions formed in a photomask allows one to select the degree of outgassing various portions of the device will be submitted to.

Figure 10:
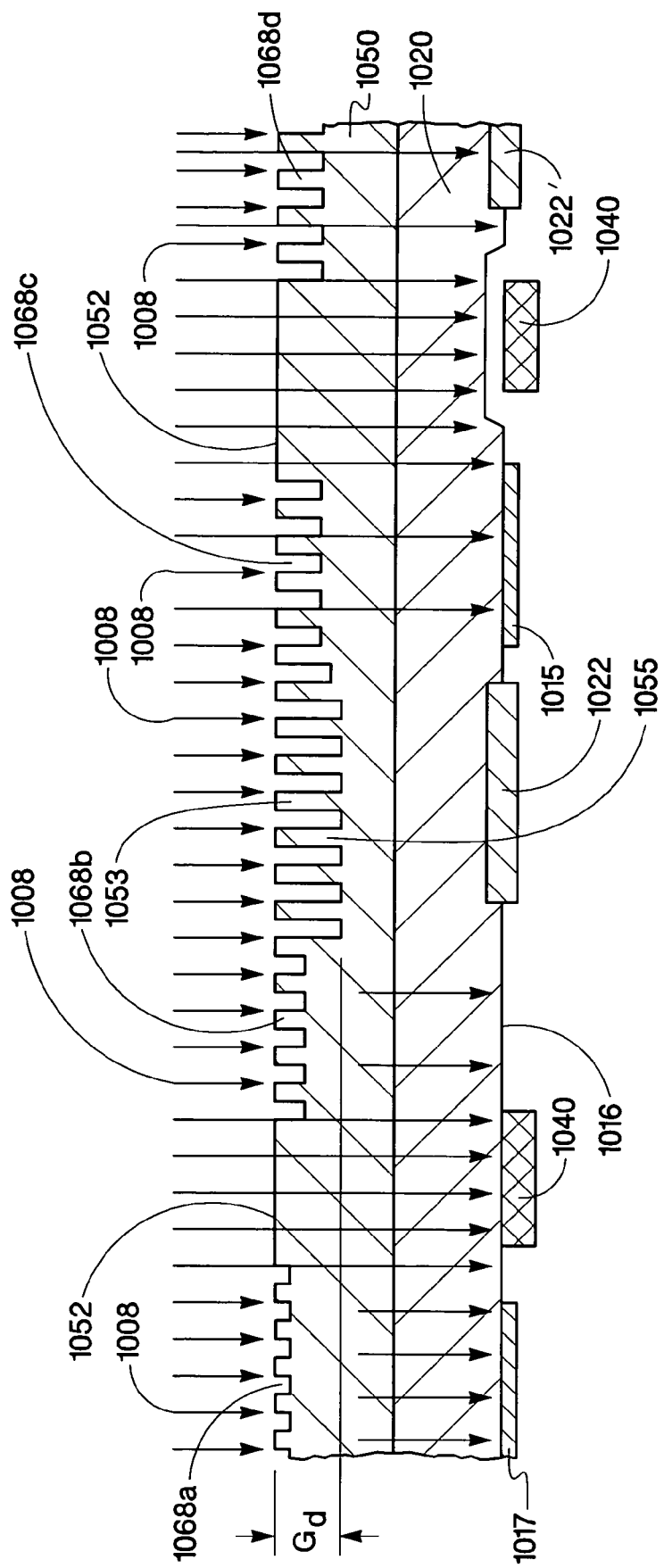
FIG. 10 is a schematic cross-sectional view of a device according to an alternate embodiment of the present invention.

For those embodiments utilizing a grating mask or a mask having absorption regions similar partial transmissive regions may be formed in the mask to provide selective heating of various portions of the substrate. An example of such a grating mask is illustrated in FIG. 10. As described above for the reflective mask having partial transmissive regions shown in FIG. 9, besides getter structures 1040, substrate 1020 includes a number of representative regions having various circuitry, materials, and devices that have varying degrees of temperature sensitivity. Partial transmission regions 1022', 1017, 1016, and 1015 are illustrated as simple regions and are not indicative of any particular structure or device. In this embodiment, photomask 1050 includes transmissive regions 1052 having transmissivities greater than 90 percent with those utilizing either antireflective coatings or openings formed in the mask substrate may approach 100 percent transmission. In addition, photomask also includes non-transmissive regions 1053 represented by destructive interference region 1055 where incident photons 1008 incident undergo destructive interference as the photons traverse through photomask 1050. The grating period is less than the wavelength of the light incident on the grating. As the photons traverse through photomask 1050 the photons traverse different thicknesses of the grating. To satisfy the condition for destructive interference the depth of the grating $G_d$ is an odd number of quarter wavelengths, of the light incident on the grating, divided by the index of refraction of the grating material as illustrated in FIG. 10. Such a mask controls both the amplitude and phase of the transmitted light. Partial transmissive regions 1068a, 1068b, 1068c, and 1068d include grating structures that produce varying degrees of destructive interference by varying the depth of the grating structure formed in photomask 1050. By varying the depth from an odd number of quarter wavelengths to the flat surface illustrated in transmissive region 1052 the amount of transmission in various regions may be varied in a similar manner as that described above for the reflective photomask.

What is claimed is:

1. A device, comprising:
   a substrate;
   a getter structure coupled to said substrate;
   a photomask having a substantially transmissive region and a substantially non-transmissive region, said getter structure laterally disposed substantially within said substantially transmissive region, wherein said substantially transmissive region transmits photons to impinge on said getter structure; and
   a device package enclosing at least said getter structure.

2. The device in accordance with claim 1, wherein a photon source illuminates said photomask, said substantially non-transmissive region of said photomask hinders the transmission of photons from said photon source to said substrate, thereby maintaining a portion of said substrate at a temperature less than an activation temperature, and photons transmitted through said substantially transmissive region heats said getter structure to said activation temperature.

3. The device in accordance with claim 1, wherein said substantially non-transmissive region covers at least a portion of said substrate, and said photomask is adapted to be uniformly illuminated, transmitting photons through said substantially transmissive region on said getter structure, thereby activating said getter structure and not transmitting photons through said substantially non-transmissive region.

4. The device in accordance with claim 1, wherein said substrate further comprises a substrate having two opposing major surfaces, a first major substrate surface and a second major substrate surface, said getter structure disposed on said first major substrate surface and said photomask disposed on said second major substrate surface.

5. The device in accordance with claim 4, further comprising a release layer disposed between said photomask and said substrate.

6. The device in accordance with claim 1, further comprising an absorption layer disposed between said substrate and said getter structure.

7. The device in accordance with claim 1, further comprising a thermal isolation structure formed on or in said substrate and disposed proximate to said getter structure.

8. The device in accordance with claim 7, wherein said thermal isolation structure further comprises a trench formed in said substrate.

9. The device in accordance with claim 7, wherein said trench encircles said getter structure.

10. The device in accordance with claim 7, wherein said thermal isolation structure further comprises a getter tether mechanically coupling said substrate to said getter structure, wherein said getter tether reduces the thermal conductivity of said getter structure to said substrate.

11. The device in accordance with claim 1, wherein said substrate further comprises:
    a cavity formed in said substrate, said cavity having sidewalls and a depth D; and
    a getter tether mechanically coupling said getter structure to said substrate, wherein said getter structure forms a suspended mass structure over said cavity.

12. The device in accordance with claim 1, wherein said getter structure further comprises:
    a support spacer having a support perimeter; and
    at least two getter layers each having a getter perimeter, wherein said support spacer disposed between said at least two getter layers, and each of said getter perimeters extends beyond said support perimeter in at least one direction of said support spacer forming a gap between each of said getter layers, thereby increasing the exposed surface area of said getter structure.

13. The device in accordance with claim 1, wherein said getter structure further comprises:
    at least two getter ribs each having at least one getter rib surface; and
    at least one getter trench, wherein said at least two getter ribs are separated by said at least one getter trench exposing said at least one getter rib surface of each getter rib to an ambient environment, thereby increasing the exposed surface area of said getter structure.

14. The device in accordance with claim 1, wherein said getter structure further comprises:
    a cavity formed in said substrate;
    a first major getter surface exposed to an ambient; and
    a second opposing major getter surface, wherein said cavity extends in at least one lateral dimension beyond said getter structure forming an opening, exposing said second opposing major getter surface to said ambient, thereby increasing the exposed surface area of said getter structure.

15. The device in accordance with claim 1, wherein said photomask, further comprises a partially transmissive region adapted to partially transmit photons emitted from a photon source.

16. The device in accordance with claim 1, wherein said photomask, further comprises a photomask substrate formed from a glass or plastic material.

17. The device in accordance with claim 16, wherein said photomask, substrate further comprises a micro-molded photomask substrate.

18. The device in accordance with claim 1, wherein said photomask further comprises a reflective photomask.

19. The device in accordance with claim 18, further comprising at least one anti-reflective layer disposed in said substantially transmissive region of said photomask.

20. The device in accordance with claim 18, wherein said reflective photomask further comprises a multi-layer reflective film.

21. The device in accordance with claim 18, wherein said reflective photomask further comprises:
    a photomask substrate; and
    a reflective layer disposed in said substantially non-transmissive region of said photomask.

22. The device in accordance with claim 21, wherein said reflective film absorbs less than 5 percent of the radiation incident on said substantially non-transmissive region.

23. The device in accordance with claim 21, wherein said reflective layer further comprises a reflective metal film.

24. The device in accordance with claim 18, wherein said reflective photomask further comprises a partially reflective region.

25. The device in accordance with claim 18, wherein said reflective photomask further comprises a partially transmissive reflective region.

26. The device in accordance with claim 18, wherein said reflective film further comprises a quarter wavelength grating structure.

27. The device in accordance with claim 18, wherein said reflective photomask, further comprises at least one transmissive opening formed in a reflective metal sheet or film.

28. The device in accordance with claim 1, further comprising:
    a sealing plate; and
    a package seal attached to said substrate and to said sealing plate wherein said package seal, said substrate, and said sealing plate define an interspace region and define said device package enclosing said getter structure.

29. The device in accordance with claim 1, wherein said getter structure includes a metal selected from the group consisting of zirconium, thorium, hafnium, vanadium, yttrium, niobium, tantalum, molybdenum, terbium, and mixtures thereof.

30. The device in accordance with claim 1, wherein said substrate forms a portion of said device package wherein said device package encloses said getter structure.

31. The device in accordance with claim 1, wherein said getter structure is comprised of a metal, selected from the group consisting of Zr—Al alloys, Zr—V alloys, Zr—V—Ti alloys, Zr—V—Fe alloys, and combinations thereof.

32. The device in accordance with claim 1, wherein said getter structure includes a zeolite.

33. The device in accordance with claim 1, further comprising an electronic device, operating at a pressure below atmospheric pressure, disposed on said substrate.

34. The device in accordance with claim 1, further comprising a mechanical device.

35. The device in accordance with claim 1, further comprising an optical device.

36. The device in accordance with claim 1, further comprising a micro-electro-mechanical system.

37. The device in accordance with claim 1, further comprising an electron emitter.

38. A storage device, comprising:
at least one device of claim 37, and
a storage medium in close proximity to said at least one device, said storage medium having a storage area in one of a plurality of states to represent information stored in that storage area.

39. A computer system, comprising:
a microprocessor;
an electronic device including at least one device of claim 1 coupled to said microprocessor; and
memory coupled to said microprocessor, said microprocessor operable of executing instructions from said memory to transfer data between said memory and said electronic device.

40. The computer system in accordance with claim 39, wherein said electronic device is a storage device.

41. The computer system in accordance with claim 39, wherein said electronic device is a display device.

42. The computer system in accordance with claim 39, wherein said microprocessor further comprises:
a substrate;
a getter structure coupled to said substrate; and
a photomask having a substantially transmissive region and a substantially non-transmissive region, said photomask disposed over said getter structure, and said substantially transmissive region substantially aligned with said getter structure.

43. The computer system in accordance with claim 39, wherein said memory further comprises:
a substrate;
a getter structure coupled to said substrate; and
a photomask having a substantially transmissive region and a substantially non-transmissive region, said photomask disposed over said getter structure, and said substantially transmissive region substantially aligned with said getter structure.

44. A device, comprising:
a substrate;
means for gettering impurities from an ambient fluid, said means for gettering coupled to said substrate;
means for masking photons having a substantially transmissive region and a substantially non-transmissive region, said substantially transmissive region transmits photons to selectively impinge on said means for gettering impurities, thereby activating said means for gettering, wherein said means for gettering does not laterally extend substantially beyond said substantially transmissive region; and
means for packaging the device wherein at least said getter is enclosed by said means for packaging.

45. The device in accordance with claim 44, wherein said means for masking photons further comprises means for masking photons disposed on said substrate.

46. The device in accordance with claim 44, wherein said means for masking further comprises means for selectively reflecting photons.

47. The device in accordance with claim 44, further comprising means for thermally isolating said means for gettering.

48. The device in accordance with claim 44, further comprising means for attaching said means for masking photons to said substrate.

49. The device in accordance with claim 44, wherein said means for gettering further comprises means for increasing said exposed surface area of said means for gettering.

50. The device in accordance with claim 49, wherein said means for increasing said exposed surface area further comprises means for separating multiple layers of a getter material.

51. The device in accordance with claim 44, means wherein said means for masking further comprises means for selectively absorbing photons.

52. The device in accordance with claim 44, wherein said means for masking photons further comprises means for partially transmitting photons.

53. A device, comprising:
a substrate;
a getter structure disposed over said substrate;
a thermal isolation structure formed on or in said substrate and disposed proximate to said getter structure; and
a photomask disposed over said substrate, said photomask having an opening and a reflective region, said opening substantially laterally encircling said getter structure, wherein photons emitted from a photon source, illuminate the device, and are transmitted through said opening impinging on said getter structure, and wherein photons impinging on said reflective region are reflected, thereby heating said getter structure maintaining a portion of said substrate under said reflective region at a lower temperature.

54. A device, comprising:
a substrate having a first and a second major substrate surface;
a thermally isolated getter structure tethered to said first major substrate surface; and
a photomask having a substantially transmissive region and a substantially non-transmissive region, said photomask releaseably attached to said second major substrate surface, wherein the thermally isolated getter structure is laterally substantially within said substantially transmissive region.

55. A device, comprising:
a substrate having a substrate interior and a substrate exterior major surface;
a thermally isolated getter structure tethered to said substrate interior major surface;

a package component having a package interior and a package exterior major surface;

a photomask having a substantially transmissive region and a substantially non-transmissive region, said photomask releaseably attached to said package exterior major surface, wherein the thermally isolated getter structure does not laterally extend substantially beyond said substantially transmissive region; and a package seal attached to said substrate and to said package component wherein said package interior major surface, said substrate interior major surface, and said package seal define an interspace region providing a package enclosing said thermally isolated getter structure.

56. A device, comprising:

a substrate;

a getter structure coupled to said substrate;

a photomask having a substantially transmissive region and a substantially non-transmissive region, said substantially transmissive region substantially aligned with said getter structure and said substantially non-transmissive region aligned with a temperature sensitive portion of the device; and an interspace region disposed between at least a portion of a package component interior major surface and said getter structure, wherein said getter structure does not extend across the entire interspace region.

* * * * *

UNITED STATES PATENT AND TRADEMARK OFFICE
CERTIFICATE OF CORRECTION

| | | |
|---|---|---|
| PATENT NO. | : 7,508,132 B2 | Page 1 of 1 |
| APPLICATION NO. | : 10/689819 | |
| DATED | : March 24, 2009 | |
| INVENTOR(S) | : Chien-Hua Chen | |

It is certified that error appears in the above-identified patent and that said Letters Patent is hereby corrected as shown below:

In column 17, line 29, in Claim 38, delete "claim 37," and insert -- claim 37; --, therefor.

Signed and Sealed this

Fourth Day of August, 2009

JOHN DOLL
*Acting Director of the United States Patent and Trademark Office*